United States Patent [19]
Tran

[11] Patent Number: 5,315,598
[45] Date of Patent: May 24, 1994

[54] METHOD TO REDUCE BURN-IN TIME AND INDUCING INFANT FAILURE

[75] Inventor: Hiep V. Tran, Carrollton, Tex.

[73] Assignee: Texas Instruments Incorporated, Dallas, Tex.

[21] Appl. No.: 680,662

[22] Filed: Apr. 4, 1991

[51] Int. Cl.[5] ............................................. G01R 31/28
[52] U.S. Cl. .................... 371/21.1; 365/201; 371/21.4
[58] Field of Search ............... 371/21.1, 21.4; 365/201

[56] References Cited

U.S. PATENT DOCUMENTS

| | | | |
|---|---|---|---|
| 4,527,254 | 7/1985 | Ryan et al. | 365/201 |
| 4,654,849 | 3/1987 | White, Jr. et al. | 371/21.1 |
| 4,751,679 | 6/1988 | Dehganpour | 365/201 |
| 4,871,963 | 10/1989 | Cozzi | 324/158 F |
| 5,109,257 | 4/1992 | Kondo | 365/201 |
| 5,119,337 | 6/1992 | Shimizu et al. | 365/201 |
| 5,155,701 | 10/1992 | Komori et al. | 365/201 |
| 5,161,159 | 11/1992 | McClure et al. | 371/22.1 |

*Primary Examiner*—Charles E. Atkinson
*Attorney, Agent, or Firm*—Peter T. Rutkowski; William E. Hiller; Richard L. Donaldson

[57] ABSTRACT

This is a method of testing (burn-in and/or stress test) any portion, preferably all, of a plurality of memory cells and the pass gates of transistors (i.e. item 38 of FIG. 2) connecting the memory cells (i.e. item 40 of FIG. 2) to datalines (i.e. item 26) of a memory device. The method is comprised of: accessing every memory cell of the portion of the plurality of memory cells; supplying, preferably by a source external to or internal to the memory device, a positive voltage, preferably greater than that used during normal usage, to a first electrode (i.e. item 46 of FIG. 2) of every accessed memory cell concurrently with supplying, preferably by a source either external to or internal to the memory device, a lower voltage, preferably around zero volts, to the other electrode (i.e. item 44 of FIG. 2) of every accessed memory cell; and supplying, preferably by a source either external to or internal to the memory device, a positive voltage, preferably greater than that used in normal usage, to every pass gate of transistors connecting each accessed memory cell to the corresponding datalines. The oxides of the pass gates are stressed by supplying a high positive voltage, preferably a voltage greater than that of normal usage, to the pass gates and supplying a lower voltage, preferably around zero volts, to the datalines.

20 Claims, 2 Drawing Sheets

METHOD TO REDUCE BURN-IN TIME AND INDUCING INFANT FAILURE

A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

NOTICE (C) Copyright, *M* Texas Instruments Incorporated 1991.

FIELD OF THE INVENTION

The invention pertains to integrated circuit test, and more particularly to burn-in and stress testing of integrated circuits.

BACKGROUND OF THE INVENTION

If a memory device is going to fail, the probability that it will fail is greatest in the periods of initial usage, known as infant failure, and in a period a number of years after extended usage, known as wear-out. In order to eliminate the sale of devices that would fail during the initial usage period, the devices are rigorously stressed for a period, which will simulate the infant failure period, known as burn-in.

Burn-in and component stress times can become quite excessive with the advent of larger and larger memory devices. Greater voltages and higher ambient temperatures are often used to speed up the burn-in and stress test processes, but further reduction in burn-in and stress test times is still necessary.

A common method of burning-in and stress testing components, is to burn-in a fraction of the devices at a time at an elevated temperature and an increased voltage, in comparison with normal operation (normal operation is considered to be the usage of a device for non-test purposes, such as typical read/write operations). In order to fully burn-in all of the devices, each fraction of devices is burnt-in for a given period of time. The total time required to test an entire memory device is determined by multiplying the number of fractions the total number of components the device is broken down into by the time required to burn-in each component.

SUMMARY OF THE INVENTION

This is a method of testing (burning-in and/or stress testing) any portion, preferably all, of a plurality of memory cells and the pass gates of transistors connecting the memory cells to datalines of a memory device. The method is comprised of: accessing every memory cell of the portion of the plurality of memory cells; supplying, preferably by a source external to or internal to the memory device, a positive voltage, preferably greater than that used during normal usage, to a first electrode of every accessed memory cell concurrently with supplying, preferably by a source either external to or internal to the memory device, a lower voltage, preferably around zero volts, to the other electrode of every accessed memory cell; and supplying, preferably by a source either external to or internal to the memory device, a positive voltage, preferably greater than that used in normal usage, to every pass gate of transistors connecting each accessed memory cell to the corresponding datalines. The oxides of the pass gates are stressed by supplying a high positive voltage, preferably a voltage greater than that of normal usage, to the pass gates and supplying a lower voltage, preferably around zero volts, to the datalines.

More specifically, the method is comprised of: supplying a positive voltage to every pass gate of the transistors which connect each memory cell of the selected portion to their corresponding datalines concurrently with supplying a lower voltage to the datalines; supplying a positive voltage to every pass gate of the transistors which connect each memory cell of the selected portion to their corresponding datalines, supplying a positive voltage to the datalines, and supplying a lower positive voltage to the other electrode of every memory cell; and supplying a positive voltage to every pass gate of the transistors which connect each memory cell of the selected portion to their corresponding datalines, supplying a positive voltage to the datalines, and supplying a negative voltage to the other electrode of every memory cell.

Although the stressing of components is described to be achieved during the burn-in procedure, various components can be stressed, during probe testing, while the devices are still on the wafer. This operation will eliminate devices with marginal oxide layers before they are packaged, thus reducing device manufacturing costs.

The present invention is currently used on 64Mbit DRAMS, as applied to many other applications and systems. A few examples are the following: personal computers, scientific workstations, video RAMs, high definition television, and enhanced definition television. The present invention serves as an integral component of the value of the system or application.

DETAILED DESCRIPTION OF PREFERRED EMBODIMENTS

Figure 1:
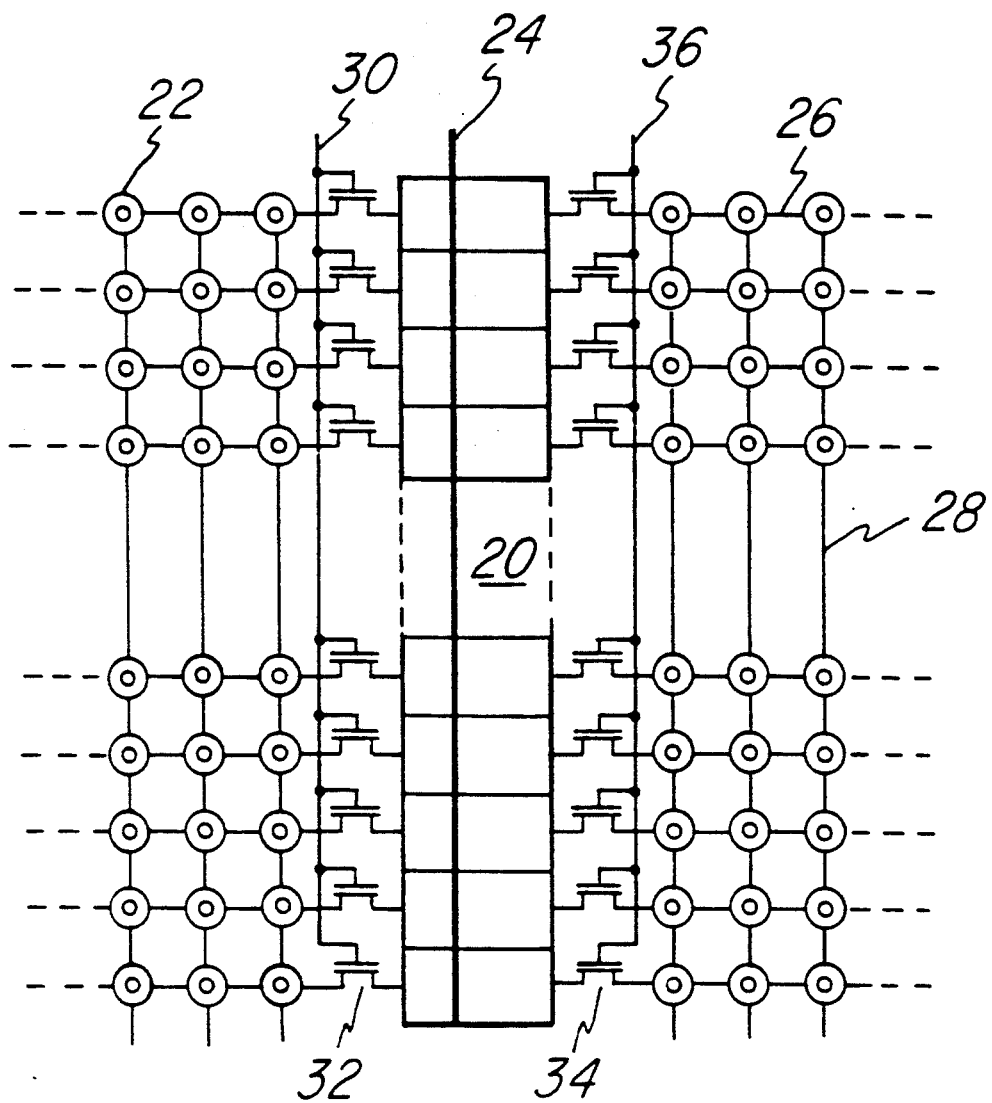
FIG. 1 is a block diagram illustrating a preferred embodiment of the present invention, FIG. 2 circuit level diagram illustrating a portion of the components illustrated in FIG. 1.
Figure 2:
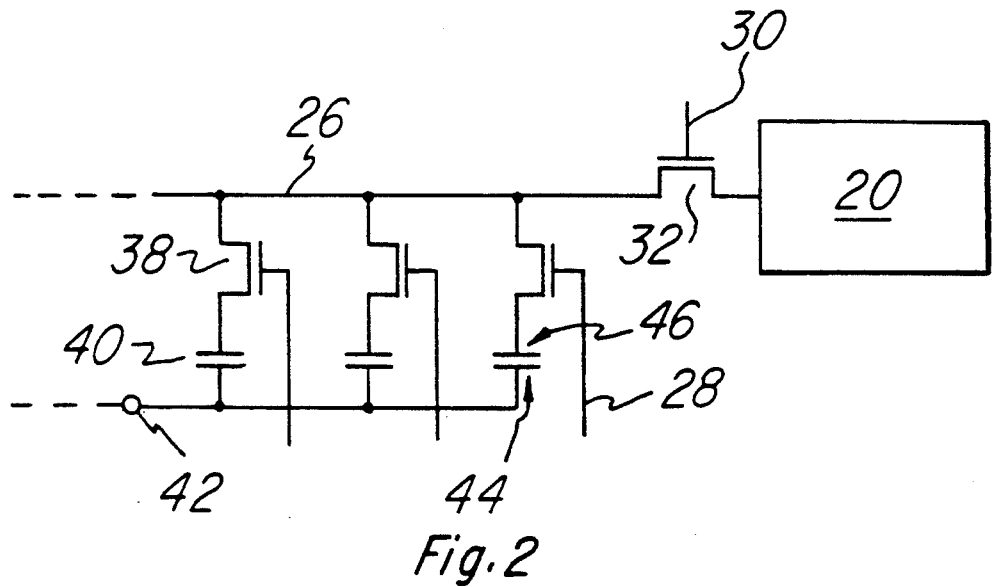

The preferred embodiment of the present invention is illustrated in FIGS. 1 and 2. FIG. 1 is a block diagram of a singular sense amplifier column, and FIG. 2 is a circuit level diagram of an array of memory cells. Like numerals are used throughout the drawings to represent like and corresponding parts.

FIG. 1 illustrates a block diagram of a singular sense amplifier column. Preferably, each sense amplifier column is comprised of a plurality of sense amplifiers 20, with a majority of the sense amplifiers 20 being selectively connected to a plurality of cells on each side of the amplifier. In order to selectively connect/disconnect a bitline 26, BL, to its associated sense amplifier 20, an FET, field effect transistor, (32 and 34) placed between the each sense amplifier and each of the associated bitlines 26 is turned on/off. All of the gates of the FETs (32 and 34) on one side of the sense amplifier column are connected to one control signal 36, $T_R$, and all of the gates of the FETs on the other side are connected to another control signal 30, $T_L$. If the control signal goes high, the bitlines 26 connect to the corresponding sense amplifier 20, and if the control signal goes low, the bitlines 26 do not connect to the sense amplifier 20. Each memory cell is connected to a bitline 26 via an FET (the FET and the memory cell are collectively illustrated as region 22 in FIG. 1), and the gate of each FET, connected between a particular bitline 26 and a memory cell, is connected to a different wordline 28, WL. If the level on the WL 28 is high, the cell connects to the bitline 26, and if the level on the WL 28 is low, the cell does not connect to the bitline 26. Each sense amplifier 20 is also connected to a precharge line 24. If the precharge line 24 goes high, and the FET (30 and/or 36) connecting the bitline to the sense amp is turned on, and one or more wordlines 28 connected to cells of one or more accessed bitlines goes high, the memory cells connected to that bitline will be charged to a high level.

FIG. 2 is an illustration of a single sense amplifier 20, a bitline 26, FETs (32 and 38), and memory cells 40. Each memory cell 40 is comprised of a pair of capacitor plates, 44 and 46. One electrode 46 is connected to the bitline 26 via an FET 38, and the other electrode 44, referred to as a field plate, is connected to the field plates of other cells and to a supply signal 42.

During burn-in, a multitude, preferably all, of the memory cells 40 are accessed by supplying a high level, either generated on the chip or supplied external to the chip, on the appropriate wordlines and the $T_R$ 36 and/or $T_L$ 30 lines. Preferably, the voltage level on the accessed wordlines is greater than the normal operating voltage levels and the level on the associated bitlines are low, preferably at a ground potential, in order to stress the pass gates of the FETs that connect the bitlines 26 to the memory cells. Also during burn-in, the bitlines 26, and therefore one electrode 46 of the accessed memory cells, are, preferably, brought to a sufficiently high voltage level (the voltage supply for the bitlines is either generated on the chip or supplied external to the chip) while the field electrode 44 is kept at a low voltage level. In order to replicate the period of time in which the probability of infant failure is the highest, the pass gates of the FETs and the memory cells are burnt-in at elevated temperatures, preferably on the order of 125° C., and the applied voltages are preferably greater than those of normal operating conditions. To assure that the memory cells, particularly the oxide separating the two plates of the capacitor, are fully stressed, the level on the field plates 44 is altered so as to be at a level of preferably the same magnitude as that on the other electrode but opposite in polarity.

Figure 3:
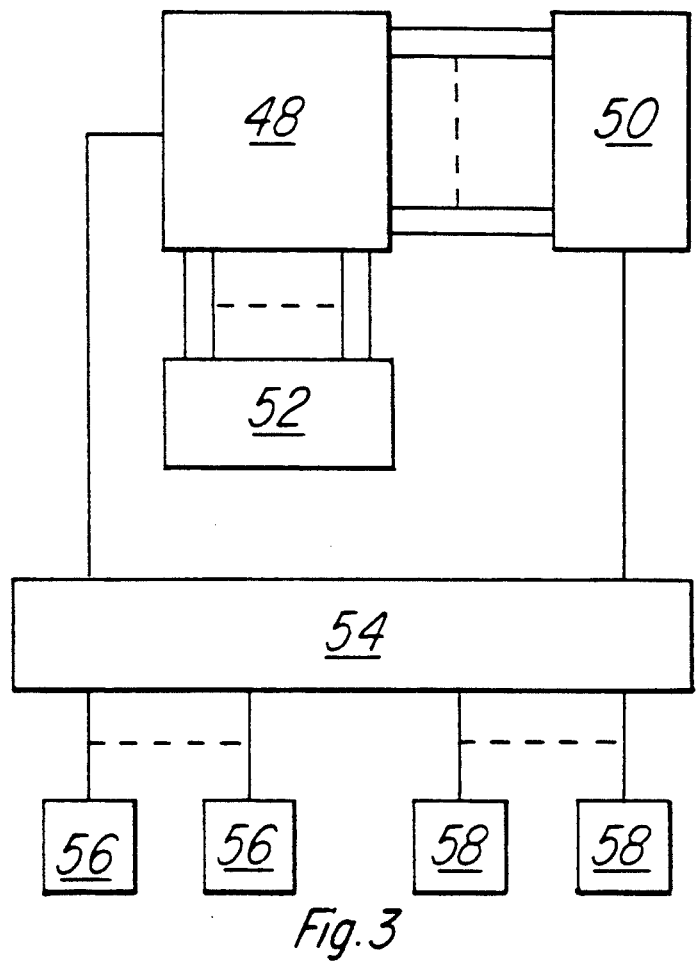
FIG. 3 is a block diagram illustrating the various inputs/outputs of the control circuits.

FIG. 3 illustrates a block diagram of a portion of the control circuits of the present invention. An on-chip control circuit 54 which receives external signals via external inputs 56 will automatically connect all, or any portion of, the wordlines (item 28 in FIGS. 1 and 2) and bitlines (item 26 in FIGS. 1 and 2) to on-chip 58 or external supplies 56 via a row decoder 54 and a sense amplifier bank 50, respectively. The row decoder is selectively connected to the memory array 48 via the wordlines, and the sense amplifier bank 50 is selectively connected to the memory array 48 via the bitlines. The control circuit 54 is also connected to the memory array by various supply and control lines.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing any portion of a plurality of memory cells and the pass gates of transistors connecting said memory cells to datalines of a memory device, said method comprising:
   a. accessing every memory cell of said portion of said plurality of memory cells;
   b. supplying a positive voltage to a first electrode of said every memory cell of said portion concurrently with supplying a lower voltage to another electrode of said every memory cell;
   c. supplying a positive voltage to every said pass gate of transistors connecting said each memory cell of said portion to said datalines; and
   d. evaluating the condition of said memory cells and pass gates to determine the acceptance or rejection of the memory cells or pass gates.

2. The method of claim 1, wherein said testing is burning-in.

3. The method of claim 1, wherein said portion of said plurality of memory cells is all of said plurality of memory cells.

4. The method of claim 1, wherein said testing of said pass gates is supplying a high positive voltage to said pass gates and supplying a lower voltage to said datalines.

5. The method of claim 1, wherein said supplying voltage to said first electrode is supplying a voltage from a source external to said memory device.

6. The method of claim 1, wherein said supplying voltage to said first electrode is supplying a voltage from a source internal to said memory device.

7. The method of claim 1, wherein said supplying voltage to said another electrode is supplying a voltage from a source external to said memory device.

8. The method of claim 1, wherein said supplying voltage to said another electrode is supplying a voltage from a source internal to said memory device.

9. The method of claim 4, wherein said supplying a high positive voltage to said pass gates is supplying a voltage from a source external to said memory device.

10. The method of claim 4, wherein said supplying a high positive voltage to said pass gates is supplying a voltage from a source internal to said memory device.

11. The method of claim 1, wherein said positive voltage supplied to said first electrode is greater in magnitude than that used in normal operation.

12. The method of claim 1, wherein said positive voltage supplied to every said pass gate is greater in magnitude than that used in normal operation.

13. The method of claim 1, wherein said lower voltage supplied to said another electrode of said every memory cell is a voltage opposite in polarity with respect to said voltage supplied to said first electrode.

14. A method to reduce manufacturing costs wherein said testing method, as recited in claim 1, is accomplished prior to device encapsulation or mounting in a package.

15. A method to reduce manufacturing costs wherein said testing method, as recited in claim 4, is accomplished prior to device encapsulation or mounting in a package.

16. The method of claim 1, wherein said memory cell is used in a system selected from the group consisting of personal computers, scientific workstations, video RAMS, high definition television, 17. A method of testing any portion of a plurality of memory cells and the pass gates of transistors connecting said memory cells to datalines of a memory device, said method comprising:
   a. supplying a positive voltage to every said pass gate of transistors connecting said each memory cell of said portion to said datalines concurrently with supplying a lower voltage to said datalines to stress pass gates;
   b. supplying a positive voltage to said every pass gate of transistors connecting said each memory cell of said portion to said datalines and supplying a positive voltage to said datalines concurrently with supplying a lower positive voltage to another electrode of said every memory cell to stress said portion of memory cells;
   c. supplying a positive voltage to said every pass gate of transistors connecting said each memory cell of said portion to said datalines and supplying a positive voltage to said datalines concurrently with supplying a negative voltage to said another electrode of said every memory cell to stress said portion of memory cells; and
   d. evaluating the condition of said memory cells and pass gates to determine the acceptance or rejection of the memory cells or pass gates.

18. The method of claim 17, wherein said positive voltage to said every pass gate of transistors is applied so as to supply a positive voltage to a first electrode of said every memory cell of said portion.

19. The method of claim 17, wherein said positive voltage to said every pass gate of transistors is applied so as to supply a positive voltage to a first electrode of said every memory cell of said portion.

20. A method to reduce manufacturing costs wherein said testing method, as recited in claim 17, is accomplished prior to device encapsulation or mounting in a package.

* * * * *